United States Patent
Mouhouche et al.

(10) Patent No.: US 10,236,919 B2
(45) Date of Patent: Mar. 19, 2019

(54) BIT INTERLEAVER AND BIT DE-INTERLEAVER

(71) Applicant: SAMSUNG ELECTRONICS CO., LTD., Gyeonggi-do (KR)

(72) Inventors: Belkacem Mouhouche, Stains Upon Thames (GB); Daniel Ansorregui Lobete, Staines Upon Thames (GB); Alain Abdel-Majid Mourad, Staines Upon Thames (GB); Hong-sil Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 103 days.

(21) Appl. No.: 14/628,456

(22) Filed: Feb. 23, 2015

(65) Prior Publication Data
US 2015/0244398 A1  Aug. 27, 2015

(30) Foreign Application Priority Data

Feb. 21, 2014 (GB) .................................. 1403121.5
Jan. 16, 2015 (KR) ........................ 10-2015-0008107

(51) Int. Cl.
*G06F 11/00* (2006.01)
*H03M 13/00* (2006.01)
(Continued)

(52) U.S. Cl.
CPC ..... *H03M 13/6552* (2013.01); *H03M 13/255* (2013.01); *H03M 13/271* (2013.01);
(Continued)

(58) Field of Classification Search
CPC .............. H03M 13/2792; H03M 13/6552
See application file for complete search history.

(56) References Cited

U.S. PATENT DOCUMENTS 7,859,987 B2   12/2010   Ouyang et al.
8,578,237 B2   11/2013   Yokokawa et al.
(Continued)

FOREIGN PATENT DOCUMENTS

CN     1773896 A    5/2006
CN   101867441 A   10/2010
(Continued)

OTHER PUBLICATIONS

International Search Report dated May 29, 2015 issued by International Searching Authority in counterpart International Application No. PCT/KR2015/001419.

(Continued)

*Primary Examiner* — Thien Nguyen
(74) *Attorney, Agent, or Firm* — Sughrue Mion, PLLC

(57) ABSTRACT

A method for bit interleaving is provided. A method includes mapping a set of bits $\underline{a}=\{a_k: k=0, 1, 2, \ldots N_{post}-1\}$ to an array $\underline{B}=\{B_{i,j}: i=0, 1, 2, \ldots, M-1; j=0, 1, 2, \ldots, N-1\}$ such that bit $a_k$ maps to $B_{k \bmod M, \lfloor k/M \rfloor}$, wherein mod denotes the modulo operator, $\lfloor \; \rfloor$ denotes the floor operator, and M and N are constants, performing at least one of—a first permutation operation comprising permuting two or more bits within each of one or more first groups of bits, wherein each first group of bits is defined by $\underline{G}^{(1)}_p = \{B_{i,p}: i=0, 1, 2, \ldots, M-1; p \in \{0, 1, 2, \ldots, N-1\}\}$ and—a second permutation operation comprising permuting two or more bits within each of one or more second groups of bits, wherein each second group of bits is defined by $\underline{G}^{(2)}_q = \{B_{q,j}: j=0, 1, 2, \ldots, N-1; q \in \{0, 1, 2, \ldots, M-1\}\}$ and de-mapping bits from $\underline{B}$ to obtain an interleaved set of bits $\underline{b}=\{b_k: k=0, 1, 2, N_{post}-1\}$ such that bit $B_{i,j}$ is de-mapped to bit $b_{Ni+j}$.

13 Claims, 13 Drawing Sheets

(51) Int. Cl.
  *H03M 13/25*  (2006.01)
  *H03M 13/27*  (2006.01)
  *H03M 13/11*  (2006.01)
  *H03M 13/15*  (2006.01)
  *H03M 13/29*  (2006.01)

(52) U.S. Cl.
  CPC ...... *H03M 13/1165* (2013.01); *H03M 13/152* (2013.01); *H03M 13/2906* (2013.01)

(56) References Cited

U.S. PATENT DOCUMENTS

| | | | |
|---|---|---|---|
| 8,798,200 B2 | 8/2014 | Xu et al. | |
| 2006/0156172 A1* | 7/2006 | Kim | H04L 1/0066 714/755 |
| 2007/0140364 A1 | 6/2007 | Ouyang et al. | |
| 2009/0063929 A1 | 3/2009 | Jeong et al. | |
| 2010/0275101 A1 | 10/2010 | Yokokawa et al. | |
| 2012/0020435 A1 | 1/2012 | Xu et al. | |
| 2013/0028238 A1* | 1/2013 | Kim | H04L 1/0071 370/336 |
| 2015/0200747 A1* | 7/2015 | Petrov | H03M 13/19 714/776 |

FOREIGN PATENT DOCUMENTS

| | | |
|---|---|---|
| CN | 101911507 A | 12/2010 |
| CN | 103580807 A | 2/2014 |
| KR | 10-2008-0083561 A | 9/2008 |
| WO | 01/05059 A1 | 1/2001 |

OTHER PUBLICATIONS

Written Opinion dated May 29, 2015 issued by International Searching Authority in counterpart International Application No. PCT/KR2015/001419.

Yokokawa et al., "Parity and Column Twist Bit Interleaver for DVB-T2 LDPC Codes", 5th International Symposium on Turbo Codes and Related Topics, Sep. 1-5, 2008, 7 pages total, IEEE, Tokyo, Japan.

Communication dated Jul. 24, 2018, from the State Intellectual Property Office of People's Republic of China in counterpart Application No. 201580009823.3.

* cited by examiner

FIG. 6A

Input sequence: 0,1,2,3,4,5,6,7,8,9,10,11,...,52,53,54,55,56,57,58,59,60,61,62,63

Write

| 0 | 8  | 16 | 24 | 32 | 40 | 48 | 56 |
|---|----|----|----|----|----|----|----|
| 1 | 9  | 17 | 25 | 33 | 41 | 49 | 57 |
| 2 | 10 | 18 | 26 | 34 | 42 | 50 | 58 |
| 3 | 11 | 19 | 27 | 35 | 43 | 51 | 59 |
| 4 | 12 | 20 | 28 | 36 | 44 | 52 | 60 |
| 5 | 13 | 21 | 29 | 37 | 45 | 53 | 61 |
| 6 | 14 | 22 | 30 | 38 | 46 | 54 | 62 |
| 7 | 15 | 23 | 31 | 39 | 47 | 55 | 63 |

FIG. 6B

Flip odd-numbered columns

| 0 | 15 | 16 | 31 | 32 | 47 | 48 | 63 |
|---|----|----|----|----|----|----|----|
| 1 | 14 | 17 | 30 | 33 | 46 | 49 | 62 |
| 2 | 13 | 18 | 29 | 34 | 45 | 50 | 61 |
| 3 | 12 | 19 | 28 | 35 | 44 | 51 | 60 |
| 4 | 11 | 20 | 27 | 36 | 43 | 52 | 59 |
| 5 | 10 | 21 | 26 | 37 | 42 | 53 | 58 |
| 6 | 9  | 22 | 25 | 38 | 41 | 54 | 57 |
| 7 | 8  | 23 | 24 | 39 | 40 | 55 | 56 |

Output sequence: 0,15,16,31,32,47,48,63,62,1,14,17, ...,54,57,6,9,8,23,24,39,40,55,56,7

= Pairs of values corresponding to values that are N positions apart in the original bit sequence transmitted in channels having the same or similar channel capacity.

| 0  | 8  | 16 | 24 | 32 | 40 | 48 | 56 |
|----|----|----|----|----|----|----|----|
| 57 | 1  | 9  | 17 | 25 | 33 | 41 | 49 |
| 50 | 58 | 2  | 10 | 18 | 26 | 34 | 42 |
| 43 | 51 | 59 | 3  | 11 | 19 | 27 | 35 |
| 36 | 44 | 52 | 60 | 4  | 12 | 20 | 28 |
| 29 | 37 | 45 | 53 | 61 | 5  | 13 | 21 |
| 22 | 30 | 38 | 46 | 54 | 62 | 6  | 14 |
| 15 | 23 | 31 | 39 | 47 | 55 | 63 | 7  |

Pairs of one-bit channels having the same or similar channel capacity

BIT INTERLEAVER AND BIT DE-INTERLEAVER

CROSS-REFERENCE TO RELATED APPLICATIONS

This application claims priority under 35 U.S.C. § 119 (a) from UK Patent Application No. GB1403121.5, filed on Feb. 21, 2014, in the UK Intellectual Property Office, and Korean Patent Application No. 10-2015-0008107, filed on Jan. 16, 2015, in the Korean Intellectual Property Office, the disclosure of which is incorporated herein by reference in its entirety.

BACKGROUND

1. Field of the Invention

The present invention relates generally to an apparatus, system and/or method for bit interleaving and/or bit de-interleaving. For example, certain embodiments of the present invention provide an apparatus, system and/or method for bit interleaving physical layer (L1) signalling for existing and future generation digital broadcasting systems, for example systems developed by the Digital Video Broadcasting (DVB) Project and/or the Advanced Television Systems Committee (ATSC).

2. Description of the Related Art

Digital broadcasting techniques allow various types of digital content, for example video and audio data, to be distributed to end users. A number of standards have been developed for this purpose, including a family of standards developed by the ATSC organization, including standards ATSC 1.0 and ATSC 2.0. The ATSC Digital Television (DTV) Standard, described in various documents, including A/52 and A/53, available at http://www.atsc.org/, have been adopted for use in terrestrial broadcasting by various countries, including the United States, Canada and South Korea.

Recently, ATSC has begun developing a new standard, known as ATSC 3.0, for a delivery method of real-time and non-real-time television content and data to fixed and mobile devices. As part of this development, ATSC has published a Call for Proposals (CFP) document (TG3-S2 Doc. #023r20, "Call for Proposals For ATSC-3.0 PHYSICAL LAYER, A Terrestrial Broadcast Standard", ATSC Technology Group 3 (ATSC 3.0), 26 March 2013), in which a stated goal is to identify technologies that could be combined to create a new physical layer of an ATSC 3.0 Standard. It is envisaged that the ATSC 3.0 system will be designed with a layered architecture and a generalized layering model for ATSC 3.0 has been proposed. The scope of the aforementioned CFP is limited to the base layer of this model, the ATSC 3.0 Physical Layer, which corresponds to Layers 1 and 2 of the ISO/IEC 7498-1 model.

It is intended that ATSC 3.0 will not require backward compatibility with existing broadcasting systems, including ATSC 1.0 and ATSC 2.0. However, the CFP states that, wherever practicable, the standard shall utilize and reference existing standards that are found to be effective solutions to meet the requirements.

Other existing standards developed for broadcasting digital content include a family of open standards developed and maintained by the Digital Video Broadcasting (DVB) Project and published by the European Telecommunications Standards Institute (ETSI). One such standard is DVB-T2, which is described in various documents, including ETSI EN 302 755 V1.3.1, ("Digital Video Broadcasting (DVB); Frame structure channel coding and modulation for a second generation digital terrestrial television broadcasting system (DVB-T2)"), and Technical Specification ETSI TS 102 831 V1.2.1 ("Digital Video Broadcasting (DVB); Implementation guidelines for a second generation digital terrestrial television broadcasting system (DVB-T2)").

In DVB-T2, data is transmitted in a frame structure, as illustrated in FIG. 1. At the top level, the frame structure 100 consists of super-frames 101a-c, which are divided into a number of T2-frames 103a-d. Each T2-frame 103a-d is sub-divided into OFDM symbols (sometimes referred to as cells), including a number of preamble symbols 105, 107a-c followed by a number of data symbols 109a-e. In a T2-frame 103a-d, the preamble symbols 105, 107a-c comprise a single P1 preamble symbol 105, followed by one or more P2 preamble symbols 107a-c.

The P1 symbol 105, located at the beginning of a T2 frame 103a-d, carries 7 bits for signalling, including Si signalling used to identify the format of the P2 symbols 107a-c and S2 signalling used to signal certain basic transmission parameters. The P2 symbols 107a-c, immediately following the P1 symbol 105, are used for fine frequency and timing synchronisation and channel estimation. The P2 symbols 107a-c carry L1 signalling information, and may also carry data. The L1 signalling is divided into L1-pre signalling and L1-post signalling. The L1-pre signalling includes basic information about the T2 frame structure 100, and enables the reception and decoding of the L1-post signalling. The L1-post signalling provides sufficient information for the receiver to decode Physical Layer Pipes (PLPs) within the T2-frames 103a-d, which carry data.

A bit stream (e.g. signalling or data) typically undergoes various types of processing and encoding before the bits are mapped to symbols (cells). Bit streams carrying different types of information (e.g. L1-pre signalling, L1-post signalling and data) are typically processed differently.

FIG. 2 illustrates one example of a Bit Interleaved Coding and Modulation (BICM) chain at the transmitter side for processing a bit stream carrying L1-post signalling. The BICM chain 200 comprises a segmenter 201 for segmenting the bit stream into blocks of size $K_{sig}$, a scrambler 203 for scrambling (i.e. permuting) the bits within each block output from the segmenter 201, and a zero padder 205 for padding each block output from the scrambler 203 with zeros to obtain a padded block of size $K_{bch}$ (e.g. $K_{bch}$=7032).

The BICM chain 200 further comprises a BCH encoder 207 for BCH encoding each block output from the zero padder 205 to obtain a BCH encoded block of size $N_{bch}$, also denoted $K_{ldpc}$ (e.g. $N_{bch}=K_{ldpc}$=7200), and an LDPC encoder 209 for LDPC encoding each block output from the BCH encoder 207 to obtain an LDPC encoded block of size $N_{ldpc}$ (e.g. $N_{ldpc}$=16200).

The BICM chain 200 further comprises a parity interleaver 211 for interleaving the LDPC parity bits of each block output from the LDPC encoder 209, and a puncturer 213 for puncturing $N_{punc}$ of the LDPC parity bits. At this point in the BICM chain 200, the zero padded bits are also removed, resulting in blocks of size $N_{post}$.

The BICM chain 200 further comprises a bit interleaver 215 for bit interleaving each block output from the puncturer 213 to obtain bit interleaved blocks of size $N_{post}$.

Finally, the BICM chain 200 further comprises a demultiplexer 217 for demultiplexing each interleaved block output from the bit interleaver 215, and a QAM mapper 219 for mapping the demultiplexed bits output from the demultiplexer 217 to QAM symbols, which are used to generate the OFDM symbols (cells) for transmission.

A corresponding chain at the receiver side processes received symbols to recover the L1-post signalling bits.

Another possible preamble structure comprises a single symbol (e.g. OFDM symbol) having a certain length (e.g. 8K) reserved only for L1-pre and L1-post signalling. In this case, the coding and puncturing patterns used for the L1-post signalling may vary, for example depending on the length of the L1-post information (i.e. the number of L1-post information bits). The coding rate and puncturing scheme may be adapted in order to fill the entire single symbol for any length of input data.

Operation of the bit interleaver 215 shown in FIG. 2 is illustrated in FIG. 3. The bit interleaver 215 is provided in the form of a block interleaver comprising $N_c$ columns and $N_{post}/N_c$ rows. As illustrated in FIG. 3, bits are read into the bit interleaver 215 column-wise and are read out from the bit interleaver 215 row-wise to obtain the interleaved sequence. The value of $N_c$ may vary, for example according to the modulation scheme and code rate used. For example, when using 16-QAM and a code rate of ½ then $N_c=8$, and when using 64-QAM and a code rate of ½ then $N_c=12$.

The structure illustrated in FIG. 2 has an advantage of being relatively simple. However, this structure also suffers a disadvantage of relatively poor performance in some cases. For example, a loss in performance of 3 dB can occur in some cases.

Therefore, what is desired is a method, apparatus and/or system for bit interleaving and/or bit de-interleaving in which performance can be improved while maintaining a relatively simple structure.

SUMMARY

It is an aim of certain exemplary embodiments of the present invention to address, solve and/or mitigate, at least partly, at least one of the problems and/or disadvantages associated with the related art, for example at least one of the problems and/or disadvantages described herein. It is an aim of certain exemplary embodiments of the present invention to provide at least one advantage over the related art, for example at least one of the advantages described herein.

The present invention is defined in the independent claims. Advantageous features are defined in the dependent claims.

An aspect of the present invention provides a computer program comprising instructions or code which, when executed, implement a method, system and/or apparatus in accordance with any aspect, claim and/or embodiment disclosed herein. A further aspect of the present invention provides a machine-readable storage storing such a program.

Other aspects, advantages, and salient features of the invention will become apparent to those skilled in the art from the following detailed description, which, taken in conjunction with the annexed drawings, disclose exemplary embodiments of the invention.

BRIEF DESCRIPTION OF THE DRAWINGS

The above and other aspects, and features and advantages of certain exemplary embodiments and aspects of the present invention will be more apparent from the following detailed description when taken in conjunction with the accompanying drawings, in which:

FIGS. 6A-6D illustrate operation of the bit interleaver shown in FIG. 5;

DETAILED DESCRIPTION OF EXEMPLARY EMBODIMENTS

Figure 1:
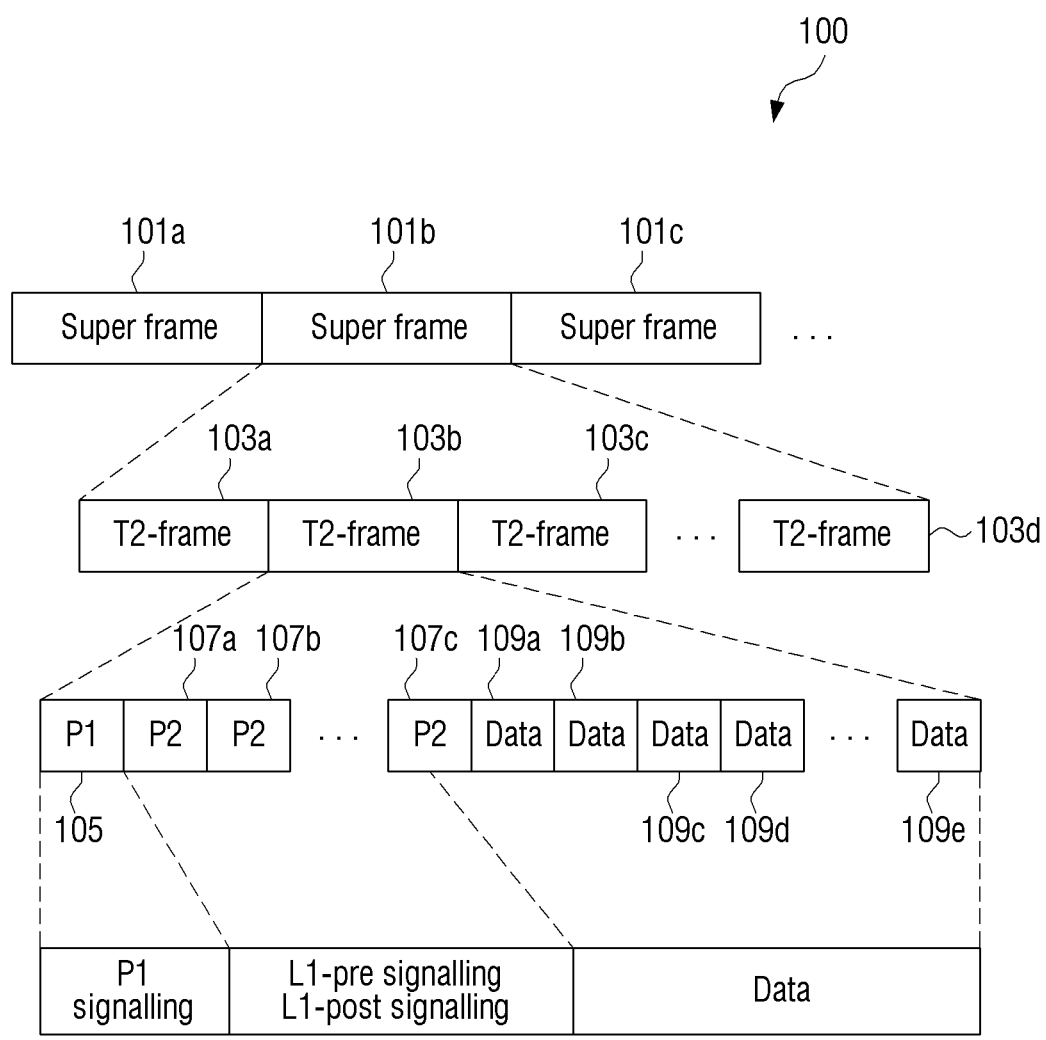
FIG. 1 illustrates a frame structure used in DVB-T2 for transmitting data.

The following description of exemplary embodiments of the present invention, with reference to the accompanying drawings, is provided to assist in a comprehensive understanding of the present invention, the scope of which is defined by the claims. The description includes various specific details to assist in that understanding but these are to be regarded as merely exemplary. Accordingly, those of ordinary skill in the art will recognize that various changes and modifications of the embodiments described herein can be made without departing from the scope of the invention.

The same or similar components may be designated by the same or similar reference numerals, although they may be illustrated in different drawings.

Detailed descriptions of techniques, features, elements, structures, constructions, functions, operations and/or processes known in the art may be omitted for clarity and conciseness, and to avoid obscuring the subject matter of the present invention.

The terms and words used herein are not limited to the bibliographical or standard meanings, but, are merely used to enable a clear and consistent understanding of the invention.

Throughout the description and claims of this specification, the words "comprise", "include" and "contain" and variations thereof, for example "comprising" and "comprises", mean "including but not limited to", and are not intended to (and do not) exclude other features, elements, components, integers, steps, processes, operations, functions, characteristics, properties and/or groups thereof.

Throughout the description and claims of this specification, the term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Throughout the description and claims of this specification, the singular form, for example "a", "an" and "the", encompasses the plural unless the context otherwise requires. For example, reference to "an object" includes reference to one or more of such objects.

Throughout the description and claims of this specification, language in the general form of "X for Y" (where Y is some action, process, operation, function, activity or step and X is some means for carrying out that action, process, operation, function, activity or step) encompasses means X adapted, configured or arranged specifically, but not necessarily exclusively, to do Y.

Features, elements, components, integers, steps, processes, operations, functions, characteristics, properties and/or groups thereof described or disclosed in conjunction with a particular aspect, embodiment, example or claim of the present invention are to be understood to be applicable to any other aspect, embodiment, example or claim described herein unless incompatible therewith.

Certain embodiments of the present invention provide various techniques (e.g. methods, apparatus and/or systems) for bit interleaving and/or bit de-interleaving. In certain embodiments, the techniques described herein may be implemented within a digital broadcasting system, including one or more existing and/or future generation digital broadcasting systems, for example systems developed by the Digital Video Broadcasting (DVB) Project and/or the Advanced Television Systems Committee (ATSC) (e.g. the ATSC 3.0 Standard). However, the skilled person will appreciate that the present invention is not limited to use in connection with any particular system or standard, and that various embodiments provide techniques for bit interleaving and/or bit de-interleaving that may be used in any suitable type of digital broadcasting system.

In certain embodiments, the techniques described herein may be used to bit interleave and/or bit de-interleave signalling data, for example L1-post signalling or signalling of a similar type. However, the skilled person will appreciate that the present invention is not limited to use in connection with any particular type of data, and that various embodiments provide techniques for bit interleaving and/or bit de-interleaving that may be used with any suitable type of data.

Furthermore, the present invention is not limited to use with any particular type of data structure or preamble structure. For example, in cases where a preamble structure is used, any suitable type of preamble structure, including any suitable type of single symbol or multi-symbol structure, may be used in certain embodiments of the present invention.

Embodiments of the present invention may be implemented in the form of any suitable method, system and/or apparatus for use in digital broadcasting. For example, certain embodiments may be implemented in the form of a mobile/portable terminal (e.g. mobile telephone), hand-held device, personal computer, digital television and/or digital radio broadcast transmitter and/or receiver apparatus, set-top-box, etc. Any such method, system and/or apparatus may be compatible with any suitable existing or future digital broadcast system and/or standard, for example one or more of the digital broadcasting systems and/or standards referred to herein.

Certain embodiments may be implemented in the form of a system comprising a transmitter side apparatus and a receiver side apparatus. The transmitter side apparatus may be configured to perform bit interleaving of data (and any further required processing and/or encoding), and transmit, to the receiver side apparatus, a signal corresponding to the bit interleaved data. The receiver side apparatus may be configured to receive the signal, and perform bit de-interleaving (and any further required processing and/or decoding). Certain embodiments may comprise a transmitter side apparatus only, a receiver side apparatus only, or a system comprising both a transmitter side apparatus and a receiver side apparatus.

Figure 2:
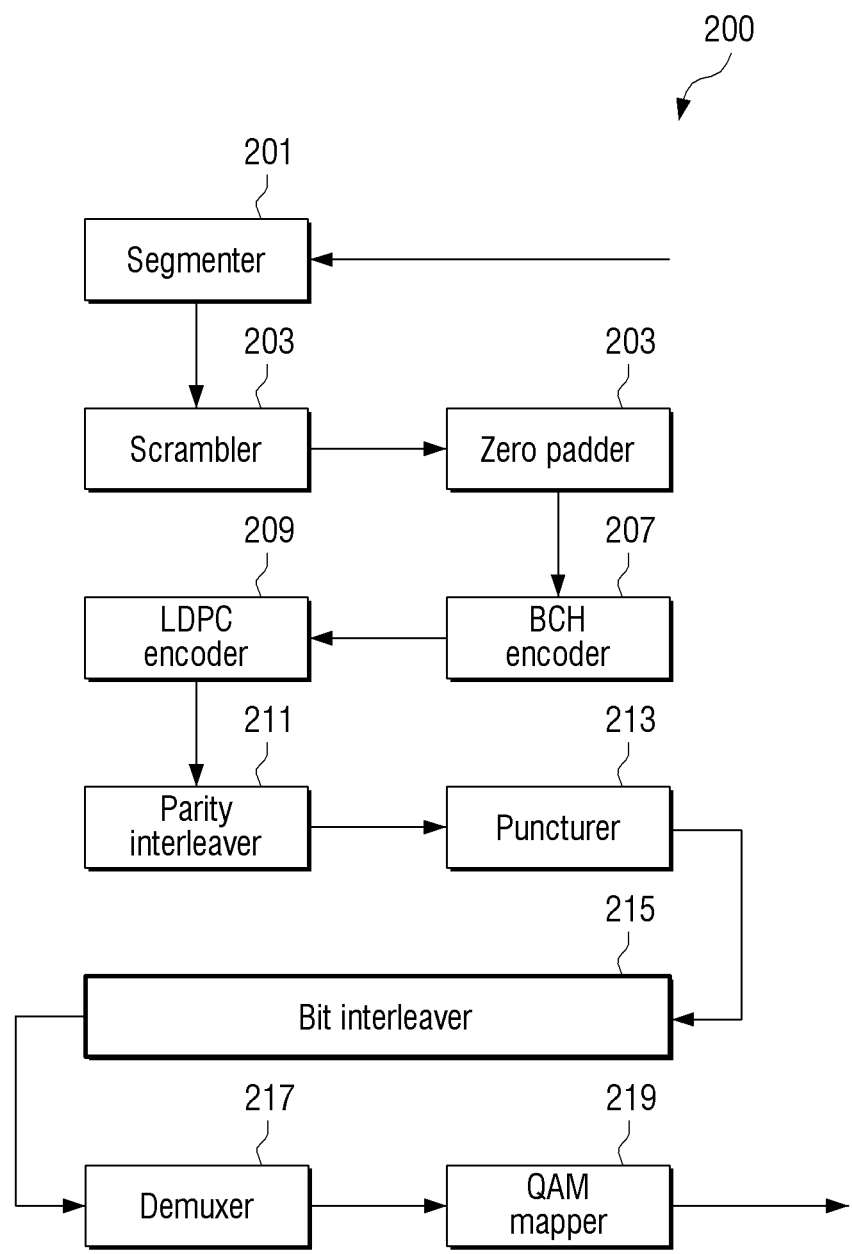
FIG. 2 illustrates one example of a BICM chain for processing a bit stream.

As described above, the structure illustrated in FIG. 2 suffers a disadvantage of relatively poor performance in some cases. One reason for this will now be described.

Figure 4:
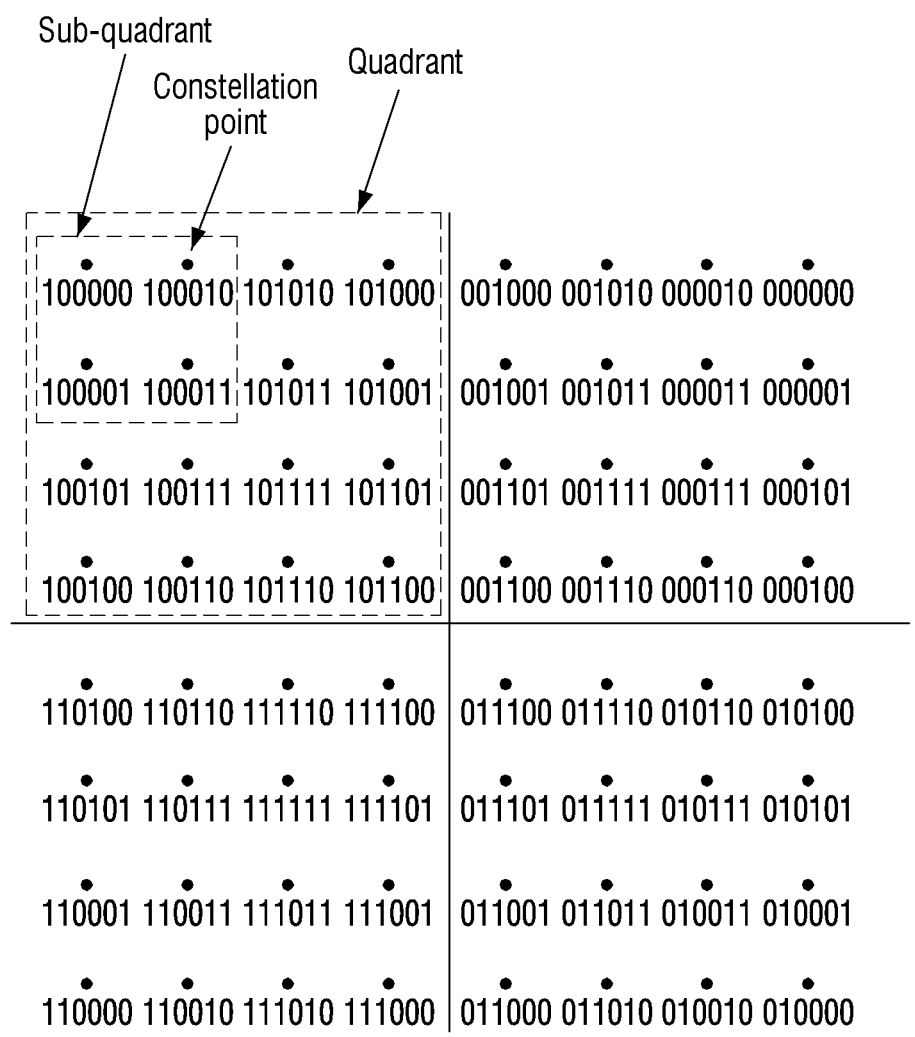
FIG. 4 illustrates a constellation diagram for 64-QAM using a Gray mapping scheme.

FIG. 4 illustrates a constellation diagram for 64-QAM in which six-bit values are mapped to respective constellation points according to a Gray mapping scheme. Using the mapping illustrated in FIG. 4, it can be seem that the two most significant bits (MSBs) of a six-bit value (bits 0 and 1) determine which quadrant of the constellation the corresponding constellation point falls into. The next two MSBs (bits 2 and 3) determine which sub-quadrant of a quadrant the corresponding constellation point falls into. Finally, the last two MSBs (bits 4 and 5) determine which of the four constellation points forming a sub-quadrant coincides with the corresponding constellation point.

Accordingly, a change in one of the first two MSBs (bits 0 and 1) corresponds to a relatively large change in position (i.e. a change in quadrant) of the corresponding constellation point. Conversely, a relatively high level of noise is required to cause an error in one of these bits. In comparison, a change in one of the next two MSBs (bits 2 and 3) corresponds to a smaller change in position (i.e. a change in sub-quadrant of a quadrant) of the corresponding constellation point, and conversely, a smaller level of noise may cause an error in these bits. Finally, a change in one of the last two MSBs (bits 4 and 5) corresponds to a relatively small change in position (i.e. a change in constellation point of a sub-quadrant) of the corresponding constellation point, and conversely, a relatively low level of noise may cause an error in these bits.

The principles described above also apply to different modulation schemes, including different orders of QAM, for example 16-QAM, 64-QAM, 256-QAM . . . , or $2^{2m}$-QAM (m=2, 3, 4, . . . ).

The individual bits of an n-bit value mapped to a constellation point of a $2^n$-QAM constellation may be regarded as passing through n respective one-bit channels. Since these individual one-bit channels are susceptible to noise to different degrees, for example for the reasons described above, the error rate for a given level of noise, and hence the channel capacity, may be different for different channels (i.e. different bits). In particular, the channel capacity for channels corresponding to lower significant bits is typically lower than for channels corresponding to higher significant bits. For certain modulation schemes, for example $2^{2m}$-QAM, pairs of channels may have the same or similar channel capacity, for example channels corresponding to pairs of bits {0,1}, {2,3} and {4,5} in the 64-QAM example described above.

Figure 3:
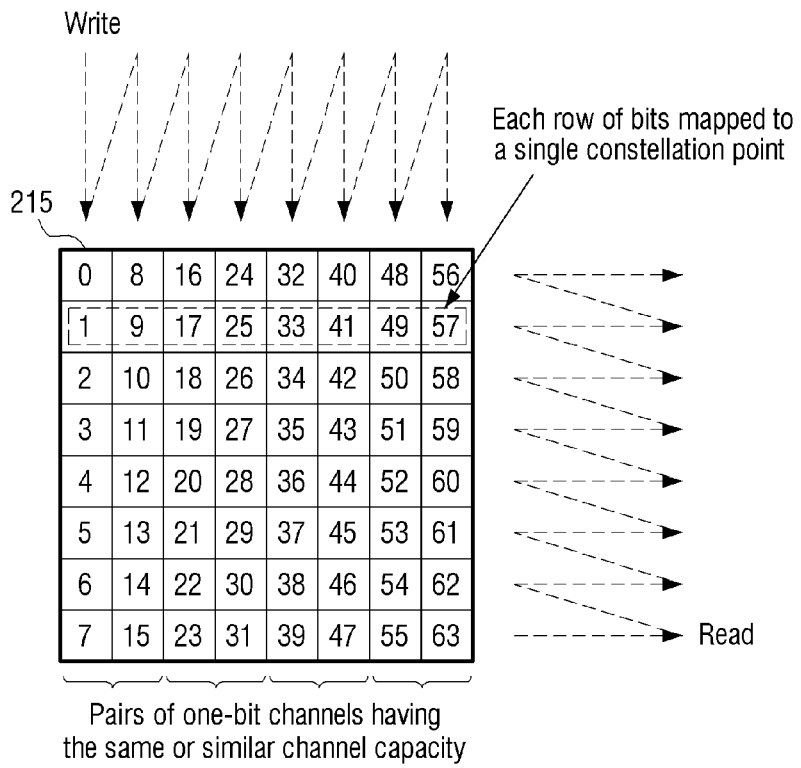
FIG. 3 illustrates operation of the bit interleaver shown in FIG. 2.

Referring back to FIG. 3, the bits mapped to a single constellation point are typically read out from the same row of the bit interleaver 215 (for example, the bits indicated by the dotted box in FIG. 3). For example, in the case of 256-QAM and the 8-column bit interleaver illustrated in FIG. 3, the 8 bits read out from a single row of the bit interleaver 215 are typically mapped to a single 256-QAM constellation point. This means that bits within the same column will be transmitted through the same one-bit channel. Furthermore, since bits are read into the bit interleaver 215 column-wise, a number of consecutive bits of the input bit stream will occupy the same column. Therefore, a number of consecutive bits of the input bit stream will all be transmitted through the same channel. This may result in a number of consecutive bits being transmitted through a channel having a poor capacity, which is undesirable.

Exemplary embodiments of the present invention provide a bit-interleaver that can avoid or mitigate the problem described above, thereby improving performance, while maintaining a relatively simple structure.

Figure 5:
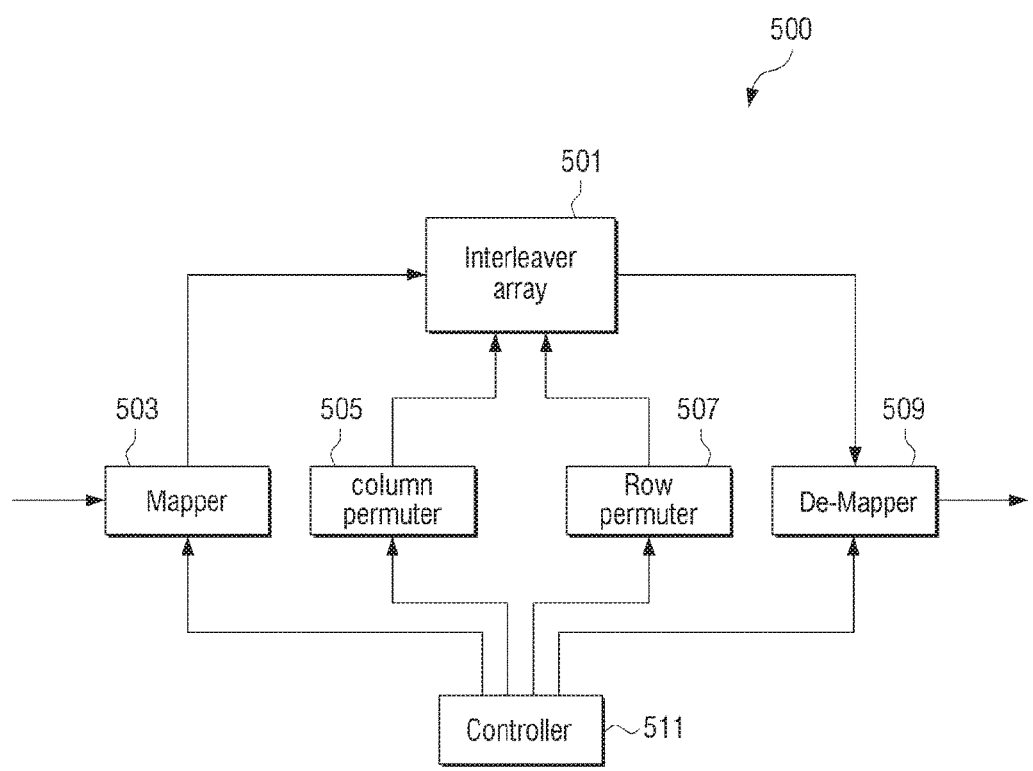
FIG. 5 illustrates the functional structure of a bit interleaver according to an exemplary embodiment of the present invention.
Figure 8:
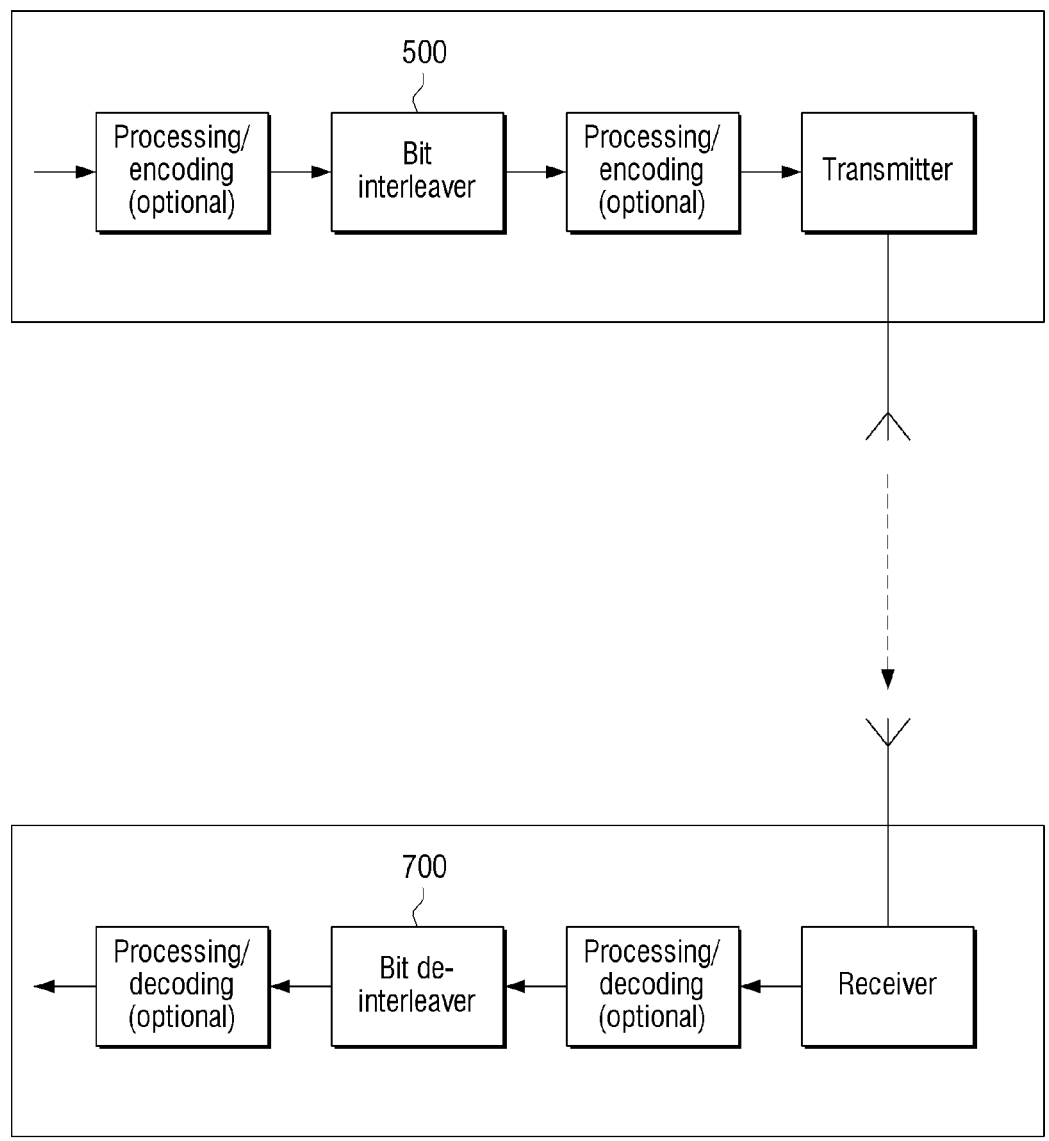
FIG. 8 illustrates a system according to an exemplary embodiment of the present invention.
Figure 9A:
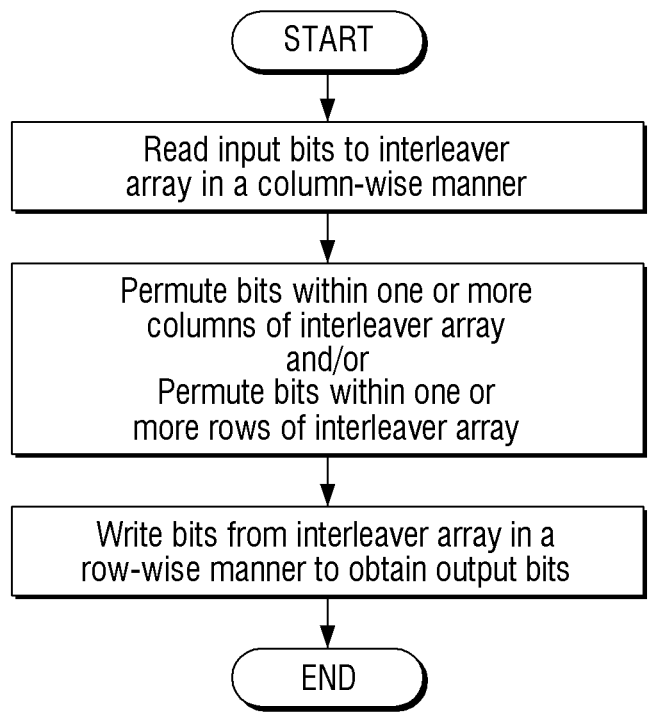
FIG. 9A is a flow chart of an exemplary method for bit interleaving according to an exemplary embodiment of the present invention.

FIG. 5 illustrates the functional structure of a bit interleaver according to an exemplary embodiment of the present invention. FIGS. 6a-d illustrate operation of the bit interleaver shown in FIG. 5. In certain embodiments, the bit interleaver may form part of a BICM chain, for example the BICM chain shown in FIG. 2. An exemplary system comprising the bit interleaver 500 shown in FIG. 5 is illustrated in FIG. 8. An exemplary method performed by the bit interleaver 500 shown in FIG. 5 is illustrated in FIG. 9A.

In the following exemplary embodiments, the bit interleaver is described in terms of a block interleaver. However, embodiments of the present invention are not limited to implementation in the form of a block interleaver. For example, in certain embodiments, the bit interleaver may be provided in an alternative form that performs bit interleaving according to the same overall interleaving pattern as that applied by an exemplary block interleaver described herein. In addition, the rows and columns of a bit interleaver described herein, and operations performed thereon, may be interchanged in alternative embodiments.

In certain exemplary embodiments described herein, an input bit sequence is first written into a block interleaver in a first direction (e.g. in a column-wise manner). Next, one or more columns (e.g. the odd-numbered columns) of the bit interleaver are permuted according to one or more first permutation patterns (e.g. the columns are flipped upside down) and/or one or more rows of the bit interleaver are permuted according to one or more second permutation patterns (e.g. the rows are cyclically shifted). Finally, an output bit sequence is obtained by reading bits from the bit interleaver in a second direction (e.g. in a row-wise manner).

As shown in FIG. 5, the bit interleaver 500 at the transmitter side comprises an interleaver array 501, a mapper 503, a column permuter 505, a row permuter 507 and a de-mapper 509. The bit interleaver 500 also comprises a controller 511 for controlling the interleaver array 501, the mapper 503, the column permuter 505, the row permuter 507 and the de-mapper 509.

In the illustrated embodiment, the column permuter 505 and the row permuter 507 are shown as separate elements. However, in certain embodiments, the column permuter 505 and the row permuter 507 may be implemented as a single permuter block.

Furthermore, embodiments of the present invention are not limited to the exemplary structure illustrated in FIG. 5. For example, in certain embodiments, the bit interleaver may be implemented in the form of a chain structure, wherein a bit sequence may be passed sequentially through various block in the chain to perform respective operation of mapping, column permuting, row permuting and de-mapping.

In addition, the references herein to an array do not necessary refer to a physical array, but can also refer to an array in a mathematical, abstract or conceptual sense. That is, a two-index variable, for example $B_{i,j}$, may be defined for the purpose of more clearly or conveniently defining a permutation operation. However, in certain embodiments, a permutation operation that is equivalent to (i.e. produces the same output given a certain input) the permutation operations described herein may be applied to a bits stored or processed solely in a linear manner.

The interleaver array 501 comprises M rows and N columns, thereby forming an M×N array of cells, wherein a cell in the ith row and jth column of the array (i=0, 1, 2, . . . , M−1 and j=0, 1, 2, . . . , N−1) may be denoted $B_{i,j}$. The mapper 503 receives an input bit sequence $\{a_k\}$ (k=0, 1, 2, . . . ) and maps bits of the input bit sequence to cells of the interleaver array 501. For example, the mapper 503 writes the input bit sequence $\{a_k\}$ into the interleaver array 501 in a column-wise manner such that bit $a_k$ is mapped to cell $B_{i,j}$, where i=k mod M and j=⌊k/M⌋, where mod denotes the modulo operator and ⌊ 540 denotes the floor operator. This mapping is illustrated in FIG. 6A.

The column permuter 505 is configured for permuting two or more cells of one or more columns of the interleaver array 501 according to one or more permutation patterns. For example, the column permuter 505 may be configured to permute all cells of every pth column, for example the set of columns $\{j\}$ such that j mod p=q, wherein p=1, 2, 3, . . . and q=0, 1, 2, . . . , p−1 are fixed values. In the illustrated embodiment, the column permuter 505 is configured to permute the odd-numbered columns, for example the set of columns $\{j\}$ such that j mod 2=1. Permuting cells within the pth column (p=0, 1, 2, . . . , N−1) may be regarded as permuting cells within a group of cells denoted $\underline{G}^{(1)}_p = \{B_{i,p}\}$ where i=0, 1, 2, . . . , M−1.

The column permuter 505 may permute some or all of the columns using the same permutation pattern, and/or may permute some or all of the columns using different permutation patterns. In the illustrated embodiment, the odd-numbered columns are each permuted using the same permutation pattern.

The column permuter 505 may permute a column using any suitable permutation pattern. For example, a bit at position $B_{i,j}$ may be permuted to position $B_{\pi_1(i),j}$, where $\pi_1(i)$ denotes a first permutation function. For example, in the illustrated embodiment, as shown in FIG. 6B, the column permuter 505 is configured to flip the jth column of the interleaver array 501 upside down such that a bit at a position $B_{i,j}$ before column permutation is permuted to a new position $B'_{i,j} = B_{M-i-1,j}$ after column permutation, i.e. such that $\pi_1(i) = M-i-1$.

The cells in a column may be permuted in any other suitable way. For example, the cells in a column may be permuted quasi-randomly. As another example, a column may be divided (e.g. equally) into two or more sub-columns and the cells of each sub-column may be independently permuted according to a certain permutation pattern (e.g. by flipping each sub-column upside down).

The row permuter 507 is configured for permuting two or more cells of one or more rows of the interleaver array 501 according to one or more permutation patterns. For example, a bit at position $B_{i,j}$ may be permuted to position $B_{i,\pi_2(j)}$, where $\pi_2(j)$ denotes a second permutation function. Permuting cells within the qth row (q=0, 1, 2, . . . , M−1) may be regarded as permuting cells within a group of cells denoted $\underline{G}^{(2)}_q = \{B_{q,j}\}$ where j=0, 1, 2, . . . , N−1. The row permuter 507 may permute some or all of the rows using the same permutation pattern, and/or may permute some or all of the rows using different permutation patterns.

Figure 6C:
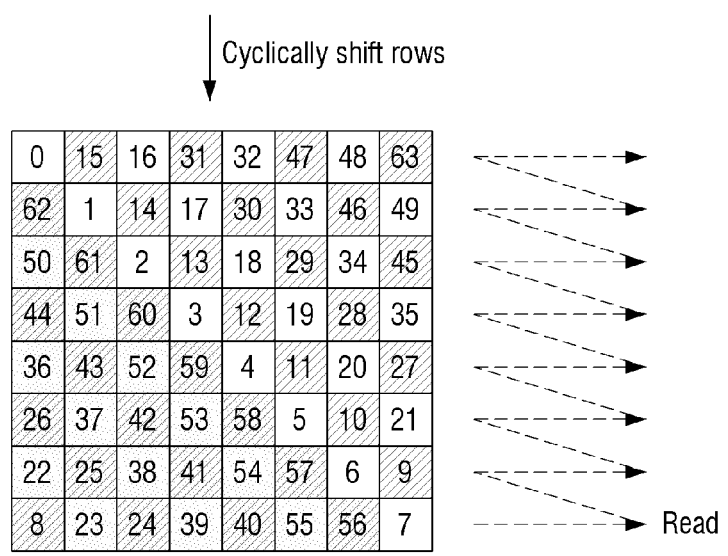

In certain embodiments, a permutation pattern may comprise a shift. For example, the row permuter 507 may be configured to shift all cells of a certain row by a certain number of cells in a certain direction (e.g. leftwards or rightwards). In the illustrated embodiment, as shown in FIG. 6C, the rows are cyclically shifted such that the lowest numbered row is not shifted, the next row is shifted to the right by one cell, the next row is shifted to the right by two cells, and so on. More generally, in the case of using shifting as the permutation patterns, the row permuter 507 is configured to shift rows such that a bit at a position $B_{i,j}$ before row permutation is permuted to a new position $B'_{i,j} = B_{i,(j+s(i)) \bmod N}$ (i.e. such that $\pi_2(j)=(j+s(i)) \bmod N$) after row permutation, where s(i) denotes a shift amount (e.g. in units of cells) defined as a function of the row number i. For example, in the illustrated embodiment, s(i)=i. In alternative embodiments, the shift amount may be defined in other ways, for example s(i)=2i or s(i)=−i.

By applying the column and row permutations described above to the interleaver array 501, an improvement in performance may be achieved. For example, by permuting different rows of the interleaver array 501 using different permutation patterns (e.g. by shifting different rows of the interleaver array 501 by different amounts), it can be seen that consecutive bits of the original input bit sequence $\{a_k\}$ that are read into the same column of the interleaver array 501 will tend to become spread over different columns following permutation of the rows. Consequently, consecutive bits of the input bit sequence $\{a_k\}$ will tend to occupy different bit positions when bits output from the bit interleaver 500 are mapped to constellation points. Hence, consecutive bits will tend to be transmitted through one-bit channels having different channel capacities, thereby reducing the chances that consecutive bits will be transmitted through a channel having a relatively low channel capacity.

In addition, by permuting certain columns of the interleaver array 501 (e.g. by flipping odd-numbered columns), a further improvement in performance may be achieved, for example for the following reason.

Figure 6D:

In the case that rows of the interleaver array 501 are shifted without the columns of the interleaver array 501 also being permuted, then as illustrated in FIG. 6D it can be seen that after the rows are shifted, the bit values occupying a particular column contain a relatively high number of pairs of values corresponding to values that are N−1 positions apart in the original bit sequence $\{a_k\}$. Furthermore, after the rows are shifted, the bit values occupying adjacent columns contain a relatively high number of pairs of values corresponding to consecutive values in the original bit sequence $\{a_k\}$ and many pairs of values corresponding to values that are N and N−2 positions apart in the original bit sequence $\{a_k\}$.

For the reasons mentioned above, bits occupying the same column will be transmitted through the same one-bit channel having a certain channel capacity. Furthermore, for the reasons mentioned above, in some cases, bits occupying adjacent columns will be transmitted through different one-bit channels having the same or similar channel capacity. Therefore, data occurring within the original bit sequence $\{a_k\}$ that repeats with certain periodicity (e.g. with period N), will tend to be transmitted through one-bit channels having the same or similar channel capacity. This may lead to such data being transmitted through channels having a relatively low channel capacity, which is undesirable.

However, by permuting certain columns, for example in the manner shown in FIG. 6C, the bit values occupying a particular column, and bit values occupying adjacent columns contain fewer pairs of values corresponding to adjacent values in the original bit sequence $\{a_k\}$ and fewer pairs of values corresponding to values that are N, N−1 and N−2 positions apart in the original bit sequence $\{a_k\}$. Hence, periodic data occurring in the original bit sequence $\{a_k\}$ is less likely to be transmitted through channels having the same or similar bit capacity, thereby reducing the chance that such data will be transmitted through channels having relatively low channel capacities. As can be seen by comparing FIGS. 6c and 6d, the case of FIG. 6D in which columns are not permuted results in many more pairs of values corresponding to values that are N positions apart in the original bit sequence (indicated in FIG. 6D by the dotted ovals) being transmitted through channels with the same or similar channel capacity.

The de-mapper 509 is configured to de-map bits from the interleaver array 501 to generate an output interleaved bit sequence $\{b_k\}$. For example, the de-mapper may be configured to read bits from the interleaver array 501 in a row-wise manner such that bit $b_k$ of the output bit sequence is de-mapped from cell $B_{i,j}$ of the interleaver array 501, where k=Ni+j.

The column permuter 505 and the row permuter 507 may be configured to operate on the interleaver array 501 in any order. For example, in some embodiments, the column permuter 505 may permute columns of the interleaver array 501 before the row permuter 507 permutes rows of the interleaver array 501. Alternatively, the row permuter 507 may permute rows of the interleaver array 501 before the column permuter 505 permutes columns of the interleaver array 501. In some embodiments, the order in which the column permuter 505 and the row permuter 507 operate on the interleaver array 501 may be controlled, for example by the controller 511.

One specific example of bit-interleaving according to an exemplary embodiment of the present invention will now be described. In this example, the input data has a length L−1 and the number of columns is denoted C. Matrices of size (R(rows), C(columns)) are defined where R=ceil(L−1/C). A first matrix output, M, is defined as M(r,c)=input(c*R+(r−1)). One example of the first matrix output is illustrated in FIG. 6A. A second matrix, A, is computed from M according to A(r,c)=M((R−r) mod R,c) for (c mod 2≠0). One example of the second matrix output is illustrated in FIG. 6B. A third matrix, B, is computed from A according to B(r,c)=A(r, (c+r) mod C). One example of the third matrix output is illustrated in FIG. 6C.

In certain embodiments, only one of the column permuter 505 and the row permuter may be provided, such that only one of columns and rows may be permuted. In other embodiments, both the column permuter 505 and the row permuter 507 may be provided, where one or both of the column permuter 505 and the row permuter 507 may be selectively activated and deactivated. This configuration allows the bit interleaver to operate according to a number of different modes, including (i) a mode in which only rows are permuted, (ii) a mode in which only columns are permuted, (iii) a mode in which both rows and columns are permuted, or (iv) a mode in which neither rows nor columns are permuted. A particular mode may be selected, for example by the controller 511, according to any suitable conditions or criteria. For example, in certain embodiments, a mode may be selected based on the length of the bit sequence $\{a_k\}$, which may be denoted $N_{post}$. 100791 The bit interleaver 500 may be configured to vary the number of columns, N, used during operation of the interleaver array 501. For example, the mapper 503 and the de-mapper 509 may be configured to map and de-map bits to and from a certain number of columns of the interleaver array 501, which may be all available columns or a subset of the available columns.

The number of columns, N, used during operation of the interleaver array 501 may be selected, for example by the controller 511, according to any suitable conditions or criteria. For example, in certain embodiments, the number of columns may be selected based on the length, $N_{post}$, of the bit sequence $\{a_k\}$. For example, for relatively high values of $N_{post}$, the number of columns may be equal to the number of bits that are mapped to each constellation point (e.g. denoted $N_{mod}$ for $2^{Nmod}$-QAM), whereas for relatively low values of $N_{post}$, the number of columns may be equal to half the number of bits that are mapped to each constellation point (e.g. $N_{mod}/2$ columns for $2^{Nmod}$-QAM). In some embodiments, the number of columns may be independent of the value of $N_{post}$ for certain constellation orders. For example, for 16-QAM ($N_{mod}$=4), the number of columns may be equal to $N_{mod}$(=4) for all values of $N_{post}$.

As described above, the selective activation and deactivation of the column permuter 505 and the row permuter 507, and the selection of the number of columns used during operation of the interleaver array 501 may be performed based, at least partly, on the length, $N_{post}$, of the bit sequence $\{a_k\}$. In some embodiments, the bit interleaver 500 may store a table containing information indicating appropriate configuration settings (e.g. activation or deactivation of the column permuter 505 and/or the row permuter 507, and the number of interleaver array 501 columns) for each value of $N_{post}$. In some embodiments the same configuration settings may be used for a range of values of $N_{post}$, in which case the table may be simplified by storing the configuration settings for each range of values, rather than for each individual value. In other embodiments, the appropriate configuration settings may be signalled by the transmitter side to the receiver side, for example using a pair of activation flags corresponding respectively to the column permuter 505 and the row permuter 507, and a field indicating the number of interleaver array 501 columns.

Figure 7:
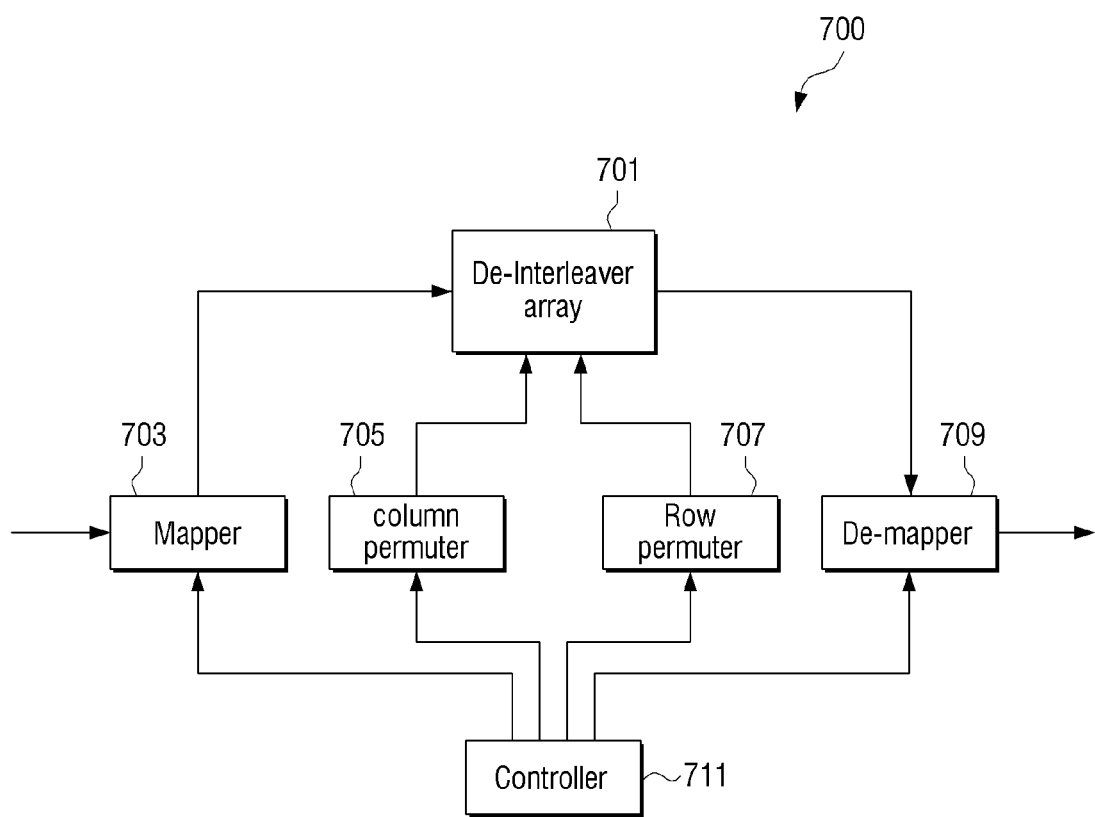
FIG. 7 illustrates the functional structure of a bit de-interleaver according to an exemplary embodiment of the present invention.
Figure 9B:
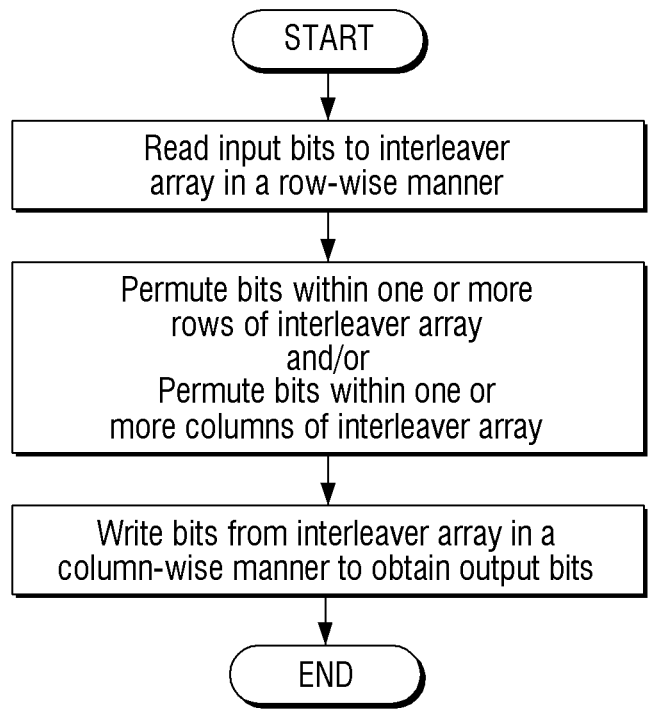
FIG. 9B is a flow chart of an exemplary method for bit de-interleaving according to an exemplary embodiment of the present invention.

At the receiver side, a bit de-interleaver corresponding to the bit interleaver at the transmitter side is provided. The bit de-interleaver is configured to bit de-interleave a bit sequence obtained by demodulating a sequence of received symbols. FIG. 7 illustrates the functional structure of a bit de-interleaver according to an exemplary embodiment of the present invention. An exemplary system comprising the bit de-interleaver 700 shown in FIG. 7 is illustrated in FIG. 8. An exemplary method performed by the bit de-interleaver 700 shown in FIG. 5 is illustrated in FIG. 9B.

As shown in FIG. 7, the bit de-interleaver 700 comprises a de-interleaver array 701, a mapper 703, a column permuter 705, a row permuter 707, and a de-mapper 709. The bit de-interleaver also comprises a controller 711 for controlling the de-interleaver array 701, mapper 703, column permuter 705, row permuter 707 and de-mapper 709.

The de-interleaver array 701 has a similar form to the interleaver array 501 at the transmitter side, and comprises M rows and N columns forming an M×N array of cells. The mapper 703 performs the inverse operation of the operation performed by the de-mapper 509 at the transmitter side. For example, the mapper 703 is configured to write a bit sequence $b_k$ row-wise into the de-interleaver array 701.

The column permuter 705 is configured to perform the inverse operation of the operation performed by the column permuter 505 at the transmitter side. For example, the column permuter 705 is configured to permute the cells of one or more columns of the de-interleaver array 701 according to one or more permutation patterns, where the permutation patterns used by the column permuter 705 are the inverses of the permutation patterns used by the column permuter 505 at the transmitter side. For example, in the case that the column permuter 505 of the transmitter side flips odd-numbered columns, the column permuter 705 of the receiver side may also flip odd-numbered columns.

Similarly, the row permuter 707 is configured to perform the inverse operation of the operation performed by the row permuter 507 at the transmitter side. For example, the row permuter 707 is configured to permute the cells of one or more rows of the de-interleaver array 701 according to one or more permutation patterns, where the permutation patterns used by the row permuter 707 are the inverses of the permutation patterns used by the row permuter 507 at the transmitter side. For example, in the case that the row permuter 507 of the transmitter side cyclically shifts the rows, the row permuter 707 of the receiver side may cyclically shift the rows, but in the opposite direction to the cyclic shifting performed by the row permuter 507 at the transmitter side.

The column permuter 705 and the row permuter 707 at the receiver side operate on the de-interleaver array 701 in the reverse order to the column permuter 505 and the row permuter 507 at the transmitter side.

The de-mapper 709 performs the inverse operation of the operation performed by the mapper 503 at the transmitter side. For example, the de-mapper 709 is configured to read a bit sequence $a_k$ column-wise from the de-interleaver array 701 to obtain the de-interleaved bit sequence.

In a similar manner described above in relation to the transmitter side, the column permuter 705 and the row permuter 707 at the receiver side may be configured to be selectively activated and deactivated, and the de-interleaver array 701 may be configured to operate using a certain number of columns. For example, the configuration settings for configuring the column permuter 705, the row permuter 707 and the de-interleaver array 701 may be determined using a table in a manner described above, or may be signalled by the transmitter side.

It will be appreciated that certain embodiments of the present invention may be implemented in the form of hardware, software or any combination of hardware and software. Any such software may be stored in the form of volatile or non-volatile storage, for example a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape or the like.

It will be appreciated that the storage devices and storage media are embodiments of machine-readable storage that are suitable for storing a program or programs comprising instructions that, when executed, implement certain embodiments of the present invention. Accordingly, certain embodiments provide a program comprising code for implementing a method, apparatus or system as claimed in any one of the claims of this specification, and a machine-readable storage storing such a program. Still further, such programs may be conveyed electronically via any medium, for example a communication signal carried over a wired or wireless connection, and embodiments suitably encompass the same.

While the invention has been shown and described with reference to certain embodiments thereof, it will be understood by those skilled in the art that various changes in form and detail may be made therein without departing from the scope of the invention, as defined by the appended claims.

What is claimed is:

1. A transmitting method of data for television (TV) broadcasting by a transmitting apparatus, the method comprising:

receiving bits to be encoded and modulated, wherein the bits are based on the data;

writing a set of the bits to a line group in a first direction, the line group comprising a plurality of lines;

performing a first permutation operation comprising permuting two or more bits within odd-numbered lines in the line group or permuting two or more bits within two or more bits within even-numbered lines in the line group;

performing a second permutation operation comprising permuting two or more bits in a first line to a second line which is different from the first line in the line group on which the first permutation operation is performed;

reading a set of permutated bits from the line group on which the second permutation operation is performed, in a second direction which is different from the first direction;

modulating the read set of permutated bits to generate a broadcast signal for the TV broadcasting by mapping the read set of permutated bits onto constellation points, bits read from a single row of each of the plurality of lines being mapped to a single constellation point; and transmitting, by the transmitter, the broadcast signal comprising an orthogonal frequency division multiplexing (OFDM) symbol, wherein the first permutation operation comprises flipping the two or more bits of the odd-numbered lines upside down or flipping the two or more bits of the even-numbered lines upside down, and wherein the second permutation operation comprises shifting the two or more bits in a first line to a second line based on a predetermined order.

2. The method according to claim 1, wherein the first permutation operation comprises permuting bits within every $g^{th}$ line.

3. The method according to claim 1, wherein the second permutation operation comprises shifting a $p^{th}$ line by an amount p.

4. The method according to claim 1, wherein the writing comprises mapping a set of bits $\underline{a} \equiv \{a_k: k=0, 1, 2, \ldots N_{post}-1\}$ to an array $\underline{B} \equiv \{B_{i,j}: i=0, 1, 2, \ldots, M-1; j=0, 1, 2, \ldots, N-1\}$ such that bit $a_k$ maps to $B_{k \bmod M, \lfloor k/m \rfloor}$, wherein mod denotes a modulo operator, $\lfloor \ \rfloor$ denotes a floor operator, and M and N are constants, wherein the first permutation operation comprises permuting two or more bits within each of one or more first groups of bits, wherein each of the one or more first groups of bits is defined by $\underline{G}^{(1)}{}_p = \{B_{i,p}: i=0, 1, 2, \ldots, M-1; p \in \{0, 1, 2, \ldots, N-1\}\}$, wherein the second permutation operation comprises permuting two or more bits within each of one or more second groups of bits, wherein each of the one or more second groups of bits is defined by $\underline{G}^2{}_q = \{B_{q,j}: j=0, 1, 2, \ldots, N-1; q \in \{0, 1, 2, \ldots, M-1\}\}$, and wherein he reading comprises de-mapping bits from $\underline{B}$ to obtain an interleaved set of bits $\underline{b} \equiv \{b_k: k=0, 1, 2, \ldots N_{post}-1\}$ such that bit $B_{i,j}$ is de-mapped to bit $b_{Ni+j}$.

5. The method according to claim 4, wherein the one or more first groups of bits are a set of first groups $\{\underline{G}^{(1)}{}_p: p \bmod g = h; g \in \{1, 2, 3, \ldots\}; h \in \{0, 1, 2, \ldots, g-1\}\}$.

6. The method according to claim 5, wherein g=2 and h=0 or 1.

7. The method according to claim 4, wherein the first permutation operation comprises permuting a bit at position $B_{i,p}$ to position $B_{\pi 1(i),p}$, wherein $\pi_1(i)$ comprises a first permutation function, and wherein $\pi_1(i) = M-i-1$.

8. The method according to claim 4, wherein the second permutation operation comprises permuting a bit at position $B_{q,j}$ to position $B_{q,\pi 2(j)}$, wherein $\pi_{2(j)}$ comprises a second permutation function.

9. The method according to claim 8, wherein $\pi_2(j)=(j+s(q)) \bmod N$, wherein $s(q)$ comprises a shift function, and wherein $s(q)=q$ or $s(q)=-q$.

10. The method according to claim 4, further comprising selecting a value of N, wherein the value of N is selected based on a value of $N_{post}$.

11. The method according to claim 10, wherein, if the value of $N_{post}$ exceeds a threshold then the value of N is selected as $N_{mod}$, and if the value of $N_{post}$ does not exceed the threshold then the value of N is selected as $N_{mod}/2$, wherein $N_{mod}$ is related to an order of a modulation scheme used to modulating the interleaved set of bits.

12. The method according to claim 10, wherein the selecting the value of N comprises obtaining the value of N using a table that stores information indicating values of N associated with values of $N_{post}$ or ranges of values of $N_{post}$.

13. A transmitting apparatus transmitting data for television (TV) broadcasting, the transmitting apparatus comprising:

at least one processor configured to:
receive bits to be encoded and modulated, wherein the bits are based on the data;
write a set of the bits to line group in a first direction, the line group comprising a plurality of lines,
perform a first permutation operation comprising permuting two or more bits within odd-numbered lines in the line group or permuting two or more bits within two or more bits within even-numbered lines in the line group,
perform a second permutation operation comprising permuting two or more bits in a first line to a second line which is different from the first line in the line group on which the first permutation operation is performed,
read a set of permutated bits from the line group on which the second permutation operation is performed, in a second direction which is different from the first direction, and
modulate the read set of permutated bits to generate a broadcast signal for the TV broadcasting by mapping the read set of permutated bits onto constellation points, bits read from a single row of each of the plurality of lines being mapped to a single constellation point; and, a transmitter for transmitting the broadcast signal comprising an orthogonal frequency division multiplexing (OFDM) symbol, wherein the first permutation operation comprises flipping the two or more bits of the odd-numbered lines upside down or flipping the two or more bits of the even-numbered lines upside down, and wherein the second permutation operation comprises shifting the two or more bits in a first line to a second line based on a predetermined order.

* * * * *